(12) United States Patent
Taguchi

(10) Patent No.: US 10,461,447 B2
(45) Date of Patent: Oct. 29, 2019

(54) SOCKET RECEIVING AN ELECTRONIC COMPONENT HAVING A PLURALITY OF CONTACT PADS

(71) Applicant: Tyco Electronics Japan G.K., Kanagawa (JP)

(72) Inventor: Hidenori Taguchi, Kanagawa (JP)

(73) Assignee: Tyco Electronics Japan G.K., Kanagawa (JP)

( * ) Notice: Subject to any disclaimer, the term of this patent is extended or adjusted under 35 U.S.C. 154(b) by 0 days.

(21) Appl. No.: 15/939,420

(22) Filed: Mar. 29, 2018

(65) Prior Publication Data

US 2018/0287276 A1  Oct. 4, 2018

(30) Foreign Application Priority Data

Mar. 31, 2017  (JP) ................ 2017-069447

(51) Int. Cl.
*H01R 12/57* (2011.01)
*H01R 12/71* (2011.01)
(Continued)

(52) U.S. Cl.
CPC ........... *H01R 12/57* (2013.01); *H01R 12/716* (2013.01); *H01R 12/727* (2013.01); *H01R 43/0249* (2013.01); *H01R 43/0256* (2013.01); *H01R 43/0263* (2013.01); *H05K 3/34* (2013.01); *H01R 4/028* (2013.01); *H01R 12/58* (2013.01); *H05K 2203/041* (2013.01)

(58) Field of Classification Search
CPC ...... H01R 9/091; H01R 12/526; H01R 12/57; H01R 12/707; H01R 12/726; H01R 12/727; H01R 43/0235; H01R 43/0249; H01R 43/0256; H01R 43/0263; H05K 3/34
USPC ............... 439/83, 84, 66, 91, 73, 82
See application file for complete search history.

(56) References Cited

U.S. PATENT DOCUMENTS

| | | | |
|---|---|---|---|
| 7,314,378 B2 * | 1/2008 | Takizawa | H05K 3/3415 174/260 |
| 7,331,796 B2 * | 2/2008 | Hougham | H05K 3/326 439/66 |

(Continued)

FOREIGN PATENT DOCUMENTS

| | | |
|---|---|---|
| JP | 10162909 A | 6/1998 |
| JP | 1174041 A | 3/1999 |

(Continued)

*Primary Examiner* — Harshad C Patel
(74) *Attorney, Agent, or Firm* — Barley Snyder

(57) ABSTRACT

A socket comprises a housing made of an insulating board and a plurality of contacts arranged on a first surface of the housing. The housing has a plurality of passageways. Each passageway extends through the housing and has an inner wall surface plated with a conductive material. The housing also has a conductive pad formed on a second surface of the housing so as to correspond to one of the passageways. The conductive pad is electrically continuous with the conductive material of the inner wall surface of the passageway and extends from the passageway. The housing also has a solder ball attached to the conductive pad. Each of the contacts corresponds to one of the plurality of passageways and is electrically connected to both the conductive material of the inner wall surface of the passageway and a contact pad of an electronic component.

8 Claims, 5 Drawing Sheets

(51) Int. Cl.
  *H01R 12/72* (2011.01)
  *H01R 43/02* (2006.01)
  *H05K 3/34* (2006.01)
  *H01R 12/58* (2011.01)
  *H01R 4/02* (2006.01)

(56) References Cited

U.S. PATENT DOCUMENTS

| | | | | |
|---|---|---|---|---|
| 7,435,102 B2 * | 10/2008 | Goodman | ........... | H01R 13/2421 361/813 |
| 7,473,104 B1 * | 1/2009 | Wertz | ..................... | H01R 13/28 439/66 |
| 7,568,922 B2 * | 8/2009 | Yamashita | ........ | H01L 23/49816 439/83 |
| 7,690,925 B2 * | 4/2010 | Goodman | ............ | H05K 7/1061 361/813 |
| 8,382,487 B2 * | 2/2013 | Jeon | ....................... | H01R 12/57 439/66 |
| 8,888,502 B2 * | 11/2014 | Terhune, IV | ...... | H01R 13/2407 439/66 |
| 2006/0148283 A1 * | 7/2006 | Minich | ................... | H01R 12/57 439/70 |
| 2008/0009148 A1 * | 1/2008 | Goodman | ............ | G01R 1/0483 439/66 |
| 2008/0293264 A1 * | 11/2008 | Trout | ................... | H01R 13/633 439/74 |
| 2012/0202363 A1 * | 8/2012 | McNamara | ........ | H01R 13/6461 439/74 |
| 2012/0252232 A1 * | 10/2012 | Buck | .................... | H01R 12/585 439/55 |

FOREIGN PATENT DOCUMENTS

| | | |
|---|---|---|
| JP | 2002314000 A | 10/2002 |
| JP | 200345532 A | 2/2003 |

* cited by examiner

SOCKET RECEIVING AN ELECTRONIC COMPONENT HAVING A PLURALITY OF CONTACT PADS

CROSS-REFERENCE TO RELATED APPLICATION

This application claims the benefit of the filing date under 35 U.S.C. § 119(a)-(d) of Japanese Patent Application No. 2017-069447, filed on Mar. 31, 2017.

FIELD OF THE INVENTION

The present invention relates to a socket and, more particularly, to a socket receiving an electronic component having a plurality of contact pads.

BACKGROUND

To electrically connect to a circuit board, large-scale electronic components are commonly mounted in a socket soldered to the circuit board instead of being directly soldered to the circuit board. The socket has multiple contacts on a first surface of a housing which contact contact pads arranged on a bottom surface of the electronic component. Multiple solder balls corresponding to the contacts are disposed on a second surface of the housing.

A liquid crystal polymer (LCP) resin is often used for the socket housing. The LCP resin, however, has a coefficient of thermal expansion different from that of the circuit board. In modern applications, a large-scale CPU may have as many as three thousand contact pads two-dimensionally arranged with a pitch of 1 mm on the bottom surface. If the housing of the socket for such a large-scale electronic component is made of the LCP resin, the difference in coefficient of thermal expansion between the LCP resin and the circuit board may cause a soldering portion to crack or may cause the socket to warp when the socket returns to ordinary temperature after being soldered to the circuit board.

Accordingly, using the same material as the circuit board for the housing of the socket is contemplated for avoid warping for large-scale electronic components. In the housing of the socket, through-holes having inner wall surfaces plated with a conductive material are formed in order to electrically connect top and bottom surfaces of the housing. The passageways are circular holes. The contacts of the socket, however, are stamped or otherwise formed from a metal sheet.

Japanese Patent No. JP-H10-162909A discloses a connector having a housing and contacts press-fitted in the housing. Each connector has a solder ball attached to the lower end. In JP-H10-162909A, however, a gap is present between a press-fit portion of the contact and a press-fit hole of the housing. For this reason, solder from the solder ball melted when the socket is soldered to the circuit board may flow up through the gap, causing insufficient soldering to the circuit board.

SUMMARY

A socket comprises a housing made of an insulating board and a plurality of contacts arranged on a first surface of the housing. The housing has a plurality of passageways. Each passageway extends through the housing and has an inner wall surface plated with a conductive material. The housing also has a conductive pad formed on a second surface of the housing so as to correspond to one of the passageways. The conductive pad is electrically continuous with the conductive material of the inner wall surface of the passageway and extends from the passageway. The housing also has a solder ball attached to the conductive pad. Each of the contacts corresponds to one of the plurality of passageways and is electrically connected to both the conductive material of the inner wall surface of the passageway and a contact pad of an electronic component.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
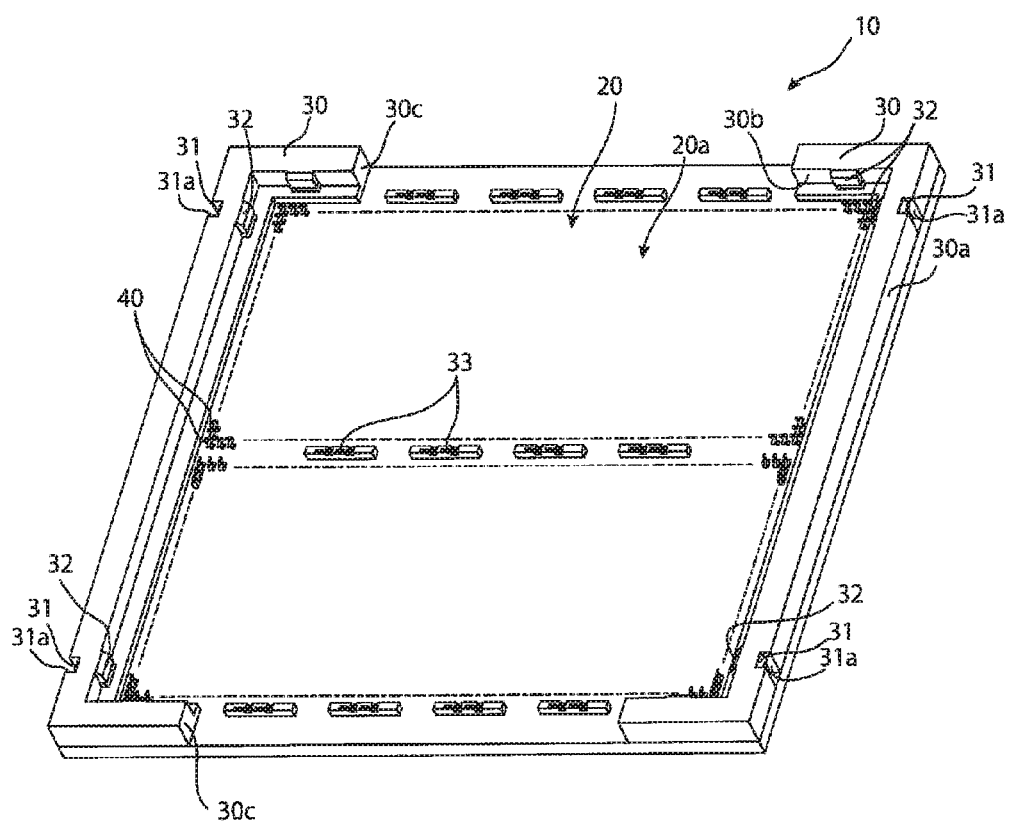
FIG. 1 is a perspective view of a socket according to an embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

A socket 10 according to an embodiment, shown in FIG. 1, has a housing 20 made of an insulating board and a frame 30 fixed to the housing 20 for positioning an electronic component to be mounted. The housing 20 is made of a same material as a circuit board (not shown) to which the socket 10 is to be soldered. The electronic component may be a large-scale CPU (not shown) configured to be mounted to the socket 10 shown in FIG. 1. As many as three thousand contact pads are two-dimensionally arranged on a bottom surface of the CPU with a pitch of 1 mm along both the length and width (1-mm grid). The array of the contact pads may be a 1.5-mm staggered array, a 0.9-mm helix, or the like. The socket 10 shown in FIG. 1 is described herein as mounting a CPU, however, the socket 10 of the present invention is applicable not only to a CPU but also to electronic components in general of a type having contact pads arranged on the bottom surface.

Multiple contacts 40 are also fixed to the housing 20; for the sake of simplicity of illustration, only a few of the multiple contacts 40 are depicted in FIG. 1. A total of three thousand contacts 40 are two-dimensionally arranged with a pitch of 1 mm in a region enclosed by dot-and-dash lines in FIG. 1 so as to correspond to the array of the contact pads on the bottom surface of the CPU to be mounted.

As shown in FIG. 1, recesses 31a are formed in an outer wall surface 30a of the frame 30, and a protrusion 31 is provided in each recess 31a. The protrusion 31 is a protrusion for catching a cap (not shown) for protecting the contacts 40 of the socket 10 not yet used. On an inner wall surface 30b of the frame 30, protrusions 32 are provided. The protrusion 32 is a protrusion for positioning the CPU mounted to the socket 10. The frame 30 is formed with cutouts 30c. The cutout 30c is a cutout for permitting a user to pinch the CPU when the CPU mounted to the socket 10 is removed therefrom. A plurality of supporting mounts 33 are provided on a first surface 20a of the housing 20; the supporting mounts 33 are mounts for seating the CPU mounted to the socket 10.

Figure 2A:
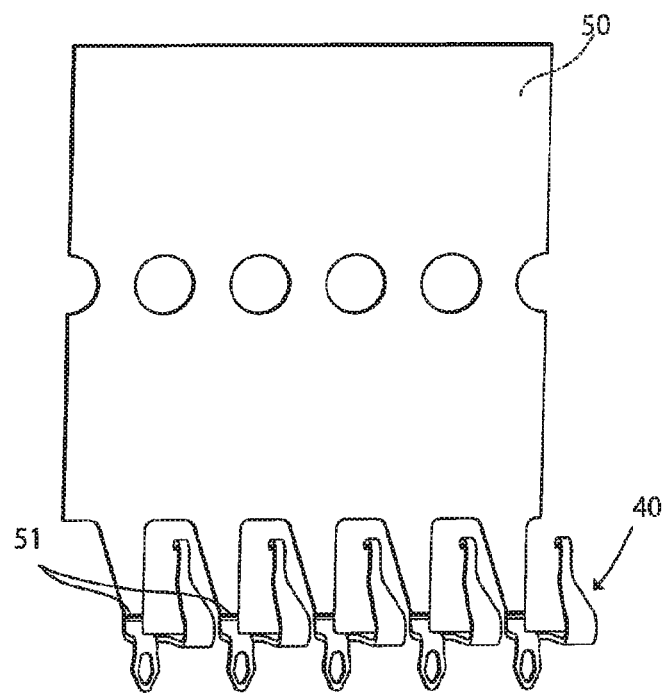
FIG. 2A is a perspective view of a plurality of contacts with a carrier.
Figure 2B:
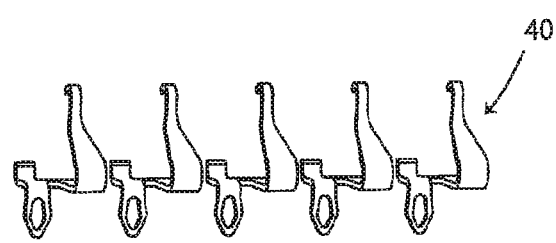
FIG. 2B is a perspective view of the contacts separated from the carrier.

The contacts 40 are shown connected to a carrier 50 in FIG. 2A and are shown separated from the carrier 50 in FIG. 2B. Multiple (three thousand in total) passageways two-dimensionally arranged with a pitch of 1 mm (1-mm grid) are formed in the housing 20 of the socket 10. The same number of contacts 40 as the passageways in one line are inserted into the passageways without being separated from a carrier 50. Thereafter, each of the contacts 40 is soldered to the housing 20. The carrier 50 is bent at notches 51 and removed except for the contacts 40, as shown in FIG. 2B.

The housing 20, as shown in FIGS. 3A-4B, is made of an insulating board and formed with a passageway 21. The passageway 21 extends completely through the housing 20 from a first surface 20a to an opposite second surface 20b of the housing 20. An inner wall surface 21a of the passageway 21 is plated with a conductive material. In the entire housing 20, the same number of passageways 21 as the multiple contacts 40 are two-dimensionally arranged with a pitch of 1 mm (1-mm grid) in the housing 20.

Figure 3A:
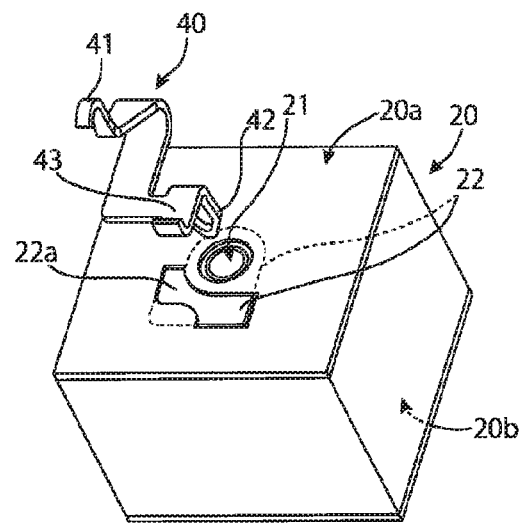
FIG. 3A is a perspective view of a portion of a housing of the socket with a contact before insertion of the contact.
Figure 3B:
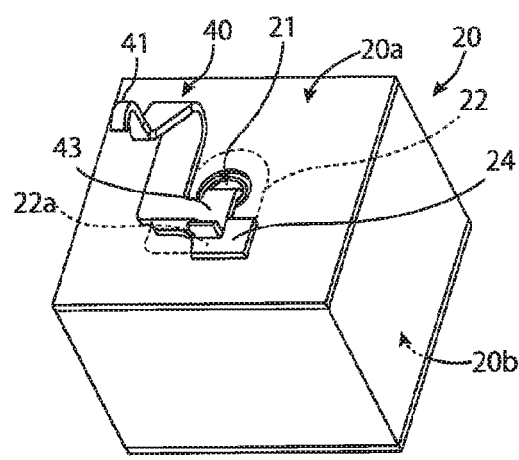
FIG. 3B is a perspective view of the portion of the housing with the contact after insertion of the contact.
Figure 4A:
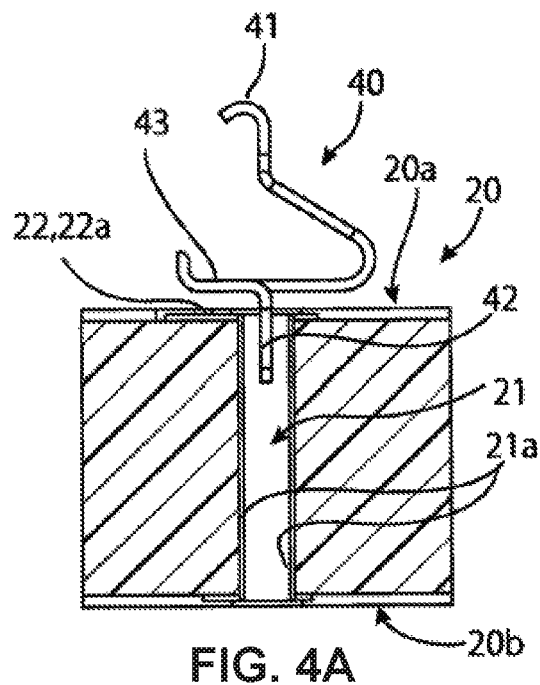
FIG. 4A is a sectional view of the portion of the housing with the contact before insertion of the contact.
Figure 4B:
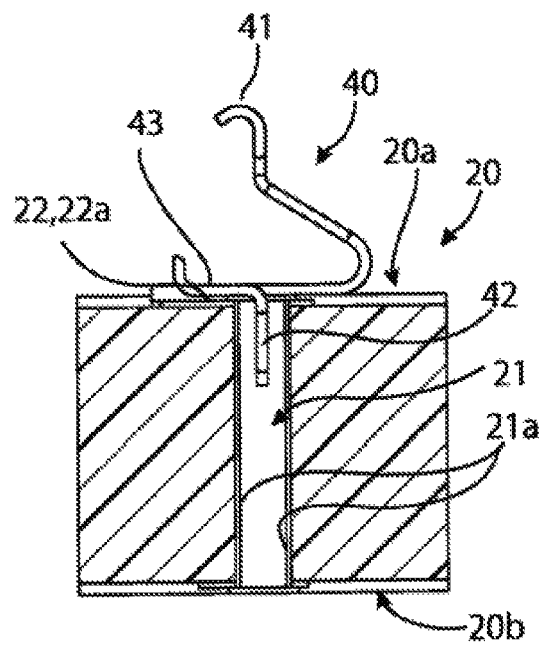
FIG. 4B is a sectional view of the portion of the housing with the contact after insertion of the contact.

As shown in FIGS. 3A and 3B, a conductive pad 22 extending from the passageway 21 is formed on the first surface 20a of the housing 20. The conductive pad 22 is formed so as to correspond to the passageway 21 and is electrically continuous with the conductive material with which the inner wall surface 21a of the corresponding passageway 21 is plated. The conductive pad 22 spreads over a region shown by a dot line in FIGS. 3A and 3B. The region enclosed by the conductive pad 22 is covered with a solder resist. The contact 40 is soldered to a region of the conductive pad 22 that is not covered with the solder resist and is separated from the passageway 21; the region separated from the passageway 21 and not covered with the solder resist is referred to as soldering region 22a.

The contact 40 is produced by stamping and bending of a sheet metal material having elasticity. The contact 40 is produced such that the multiple contacts 40 are connected to the carrier 50, as shown in FIG. 2A, and the contact 40 kept connected to the carrier 50 is disposed on the first surface 20a of the housing 20. The contact 40 is separated from the carrier 50 after the contact 40 is soldered to the housing 20.

The contact 40, as shown in FIGS. 3A-4B, has a contact portion 41, a press-fit portion 42, and a solder-joint portion 43. The contact portion 41 is elastically deformed by being pressed by the contact pad on the bottom surface of the CPU mounted to the socket 10 and establishes electrical contact with the contact pad. The press-fit portion 42 is inserted into the passageway 21 and has an eye-of-needle shape. The width of the press-fit portion 42 is slightly wider than the inner diameter of the passageway 21, accordingly, the press-fit portion 42 is press-fitted into the passageway 21 and is elastically deformed by being pressed by the inner wall surface 21a of the passageway 21.

Since the contact 40 has the press-fit portion 42 press-fitted into the passageway 21, the position and/or attitude of the contact 40 is temporarily fixed. However, if the contact 40 is left as it is, the position or attitude of the contact 40 may change. The solder-joint portion 43 is soldered to the soldering region 22a of the conductive pad 22 after the press-fit portion 42 is press-fitted into the passageway 21. Thereafter, as described above, by bending and breaking the carrier 50, each of the contacts 40 is separated from the carrier 50 so that each of the contacts 40 becomes an independent piece. Though described as a solder-joint portion 43, the joint portion may be another joint portion, such as a laser-beam-welding joint portion, adhesion using conductive resin, ultrasonic welding, pressure welding, or the like.

The soldering region 22a of the conductive pad 22 is a region separated from the passageway 21 as shown in FIGS. 3A-4B. Accordingly, a solder 24 on the soldering region 22a is reliably prevented from flowing into the passageway 21 when the solder 24 is melted for soldering the contact 40. A region of the conductive pad 22 between the soldering region 22a and the passageway 21 is further covered with the solder resist in an embodiment and, accordingly, the solder in the soldering region 22a is further reliably prevented from flowing into the passageway 21 when the solder on the soldering region 22a is melted.

The conductive pad 22 including the soldering region 22a is electrically continuous with the conductive material of the inner wall surface 21a of the passageway 21. Soldering ensures that the contact 40 establishes electrical continuity with the second surface 20b of the housing 20 via the conductive pad 22 and the conductive material of the inner wall surface 21a of the passageway 21. Accordingly, the press-fit portion 42 is not required to ensure electrical continuity with the conductive material of the inner wall surface 21a of the passageway 21; the press-fit portion 42 is designed to be inserted with a pressure suitable for temporarily retaining the contact 40 until the contact 40 is soldered.

The second surface 20b of the housing 20 will now be described with reference to FIGS. 5A-5C.

Figure 5A:
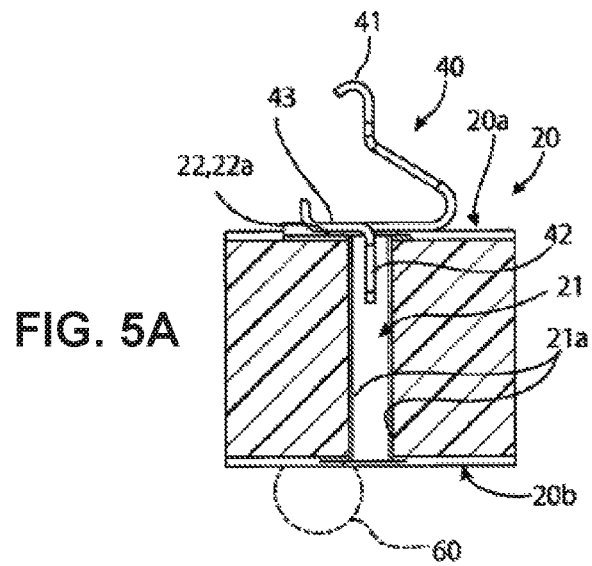
FIG. 5A is a sectional view of the portion of the housing with a solder ball and the contact after insertion of the contact.
Figure 5B:
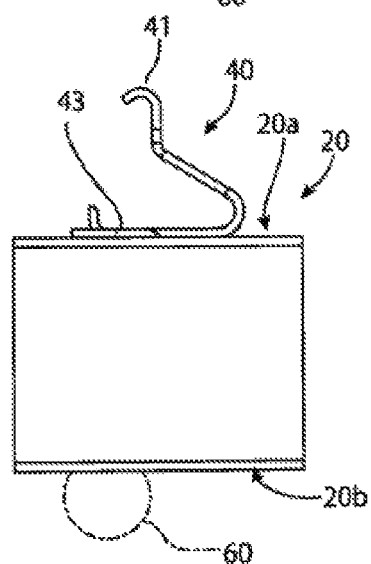
FIG. 5B is a side view of the portion of the housing with the solder ball and the contact after insertion of the contact.
Figure 5C:
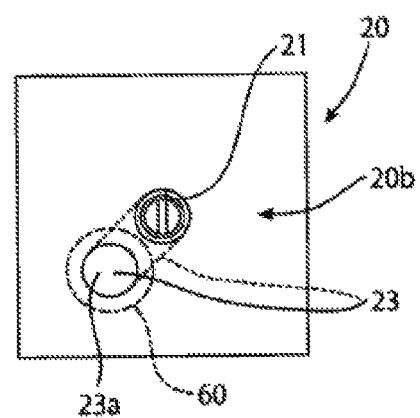
FIG. 5C is a bottom view of the portion of the housing with the solder ball and the contact after insertion of the contact.

A solder ball 60 is attached to the second surface 20b of the housing 20 as shown in FIGS. 5A-5C. Over the entire housing 20, the solder balls 60 are two-dimensionally arranged with the same pitch as the array pitch of the contacts 40.

Also on the second surface 20b of the housing 20, as shown in FIG. 5C, a conductive pad 23 spreading from the passageway 21 is formed, as in the case of the first surface 20a. The conductive pad 23 is also formed, as in the case of the conductive pad 22 on the first surface 20a side, such that multiple conductive pads 23 correspond to the respective passageways 21. The conductive pad 23 is continuous with the conductive material of the inner wall surface 21a of the corresponding passageway 21 and extends over a region dotted in FIG. 5C. The region dotted in FIG. 5C is covered with a solder resist.

The ball 60 is attached to a region of the conductive pad 23 that is not covered with the solder resist and is separated from the passageway 21. The region of the conductive pad 23 that is separated from the passageway 21 and not covered with the solder resist is a region at which the socket 10 is to be soldered to the circuit board; this region is here referred to as soldering region 23a. The solder ball 60 attached to the soldering region 23a is melted when the socket 10 is soldered to the circuit board. Since the melted solder from the solder ball 60 is located away from the passageway 21, the melted solder of the solder ball 60 is prevented from flowing into the passageway 21. The soldering region 23a of the conductive pad 23 and the passageway 21 are also separated by the solder resist and, accordingly, the melted solder is further reliably held in the soldering region 23a.

What is claimed is:

1. A socket, comprising;
   (a) a housing made of an insulating board and having:
      (1) a plurality of passageways arranged in the housing, each of the passageways extending through the housing from a first surface of the housing to an opposite second surface of the housing and having an inner wall surface plated with a conductive material;
      (2) a first conductive pad formed on the second surface of the housing so as to correspond to one of the passageways, the first conductive pad being electrically continuous with the conductive material of the inner wall surface of the passageway and extending from the passageway; and
      (3) a solder ball attached to the first conductive pad; and
   (b) a plurality of contacts arranged on the first surface of the housing, each of the contacts further having a contact portion positioned above the first surface of the housing, a solder-joint portion to be surface mounted on a second conductive pad along the first surface of the housing, and an insertion portion corresponding to one of the plurality of passageways to be press-fitted into one of the plurality of passageways and separated along a length of the insertion portion, from the conductive material of the inner wall surface of the passageway and from the second surface, and the contact being electrically connected to both the conductive material of the inner wall surface of the passageway and a contact pad of an electronic component.

2. The socket of claim 1, wherein the solder ball is attached to a soldering region of the first conductive pad spaced apart from the passageway.

3. The socket of claim 2, wherein a region of the first conductive pad between the soldering region and the passageway is covered with a solder resist.

4. The socket of claim 1, wherein the housing has the second conductive pad formed to correspond to one of the passageways, the second conductive pad being electrically continuous with the conductive material of the inner wall surface of the passageway and extending from the passageway.

5. The socket of claim 4, wherein each of the contacts includes:
   (a) the contact portion configured to be elastically deformed by the contact pad;
   (b) the insertion portion inserted into one of the passageways and configured to be elastically deformed and pressed by the inner wall surface of the passageway; and
   (c) the solder-joint portion joined to the second conductive pad.

6. The socket of claim 5, wherein the solder-joint portion is surface-mounted and soldered to the second conductive pad.

7. The socket of claim 6, wherein the solder-joint portion is soldered to a soldering region of the second conductive pad spaced apart from the passageway.

8. The socket of claim 7, wherein a region of the second conductive pad between the soldering region and the passageway is covered with a solder resist.

* * * * *